(12) United States Patent
Oshio et al.

(10) Patent No.: US 6,274,890 B1
(45) Date of Patent: Aug. 14, 2001

(54) SEMICONDUCTOR LIGHT EMITTING DEVICE AND ITS MANUFACTURING METHOD

(75) Inventors: Hiroaki Oshio; Iwao Matsumoto; Tsuguo Uchino; Hiroshi Nagasawa; Tadashi Umegi, all of Kitakyushu; Satoshi Komoto, Suginami-ku, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/006,233

(22) Filed: Jan. 13, 1998

(30) Foreign Application Priority Data

Jan. 15, 1997 (JP) .................................. 9-017370

(51) Int. Cl.⁷ ........................................ H01L 33/00
(52) U.S. Cl. ........................ 257/98; 257/99; 257/100; 257/789; 257/795
(58) Field of Search .................... 257/98, 99, 100, 257/789, 795

(56) References Cited

U.S. PATENT DOCUMENTS

| | | |
|---|---|---|
| 3,774,086 | 11/1973 | Vincent . |
| 3,875,473 | 4/1975 | Lebailly . |
| 4,152,624 | 5/1979 | Knaebel . |
| 4,179,619 * | 12/1979 | Cook ................................ 250/551 |
| 5,040,868 | 8/1991 | Waitl et al. . |
| 5,043,716 | 8/1991 | Latz et al. . |
| 5,177,593 * | 1/1993 | Abe ................................... 257/98 |
| 5,266,817 | 11/1993 | Lin . |
| 5,298,768 * | 3/1994 | Okazaki ........................... 257/100 |
| 5,404,282 | 4/1995 | Klinke et al. . |
| 5,535,230 * | 7/1996 | Abe ................................... 257/98 |
| 5,798,536 * | 8/1998 | Tsutsui ............................. 257/98 |
| 5,813,753 * | 9/1998 | Vriens ............................... 257/98 |

FOREIGN PATENT DOCUMENTS

| | | |
|---|---|---|
| 4242842 A1 | 8/1993 | (DE) . |
| 4340864 A1 | 6/1995 | (DE) . |
| 0033474 A2 | 8/1981 | (EP) . |
| 0632511 A2 | 1/1995 | (EP) . |
| 0684648 A2 | 11/1995 | (EP) . |
| 2098002 * | 11/1982 | (GB) ................................ 257/99 |
| 52-18190 * | 2/1977 | (JP) ................................. 257/100 |
| 58-43584 * | 3/1983 | (JP) ................................... 257/98 |
| 62-4380 * | 1/1987 | (JP) ................................. 257/100 |
| 1-152676 * | 6/1989 | (JP) ................................... 257/98 |
| WO 83/00408 | 2/1983 | (WO) . |

* cited by examiner

Primary Examiner—Jerome Jackson, Jr.
(74) Attorney, Agent, or Firm—Hogan & Hartson, LLP

(57) ABSTRACT

A semiconductor light emitting device includes a semiconductor light emitting element (1), a resin stem (10) having a recess (7), and a projection (9) made of a light-transmissive thermosetting resin on the resin stem so as to cover the entire upper surface and continuous upper part of side surfaces of the resin stem to a predetermined depth. The recess is filled with a light-transmissive resin encapsulating element (5) to embed the semiconductor light emitting element, one end of an externally extended first lead (21) and one end of an externally extended second lead (22) electrically connected to first and second electrodes of the semiconductor light emitting element, and a bonding wires (4) connecting the second lead to the second electrode. The projection functions as a lens and is made by hardening a fluid-state resin in an encapsulating case mold. Since the projection extends over the upper surface and upper part of side surfaces continuous from the upper surface, it is firmly bonded to the resin stem with a high adherability.

25 Claims, 14 Drawing Sheets

Convex liquid surfaces of the fluid-state thermosetting resin

SEMICONDUCTOR LIGHT EMITTING DEVICE AND ITS MANUFACTURING METHOD

BACKGROUND OF THE INVENTION

1. Field of the Invention

This invention relates to a semiconductor light emitting device used in indicators, message boards, or other visual display devices, which is improved in adherability of a resin encapsulating element and a resin stem, and also relates to a method for manufacturing same.

2. Description of the Prior Art

In conventional semiconductor light emitting devices, after a semiconductor light emitting element is mounted and bonded to a printed board with a printed wiring, a light-transmissive resin is injected into a cavity defined by a case mold capped onto the printed board to form an encapsulating element having a lens function.

These semiconductor light emitting devices are expensive, and the injected resin often leaks. Moreover, chips, unfilled portions or bubbles are liable to be made in the encapsulating element, resulting that the devices are not satisfactory in their appearances. Additionally, the use of an expensive printed board and a slow injection speed cause a high manufacturing cost.

On the other hand, a surface-packaged semiconductor light emitting device having no lens is as shown in FIG. 22. A resin stem 10 has formed a recess 7, and a semiconductor light emitting element 1 is put on the bottom of the recess 7. The sloped side walls 8 of the recess 7 functions as light reflective surfaces. Leads 21 and 22 are embedded in the resin stem 10. The leads 21, 22 are incorporated by molding a lead frame in form of a thin Fe- or Cu-based metal plate. The resin stem 10 is made by injection-molding a thermoplastic resin such as polycarbonate (PC) containing a filler agent such as silica ($SiO_2$) together with the lead frame. End portions of the leads 21, 22 for contact with the semiconductor light emitting element lie on the bottom surface of the recess 7 of the resin stem 10. The semiconductor light element 1 is mounted on the lead 21 by conductive paste 3, or the like, containing silver (Ag), for example. A first electrode of the semiconductor light emitting element 1 is connected to the lead 21, and a second electrode is electrically connected to the lead 22. The second electrode and the lead 22 are connected by a bonding wire 4 of gold (Au), for example. A light-transmissive resin encapsulating element 5 of a thermosetting resin is applied onto the resin stem 10 so as to cover these end portions of the leads 21, 22, semiconductor light emitting element 1 and bonding wire 4.

However, the surface-packaged semiconductor light emitting device shown in FIG. 22 has no lens, and is unreliable in adherability between the resin encapsulating element of a thermosetting resin and a resin stem of a thermoplastic resin.

SUMMARY OF THE INVENTION

It is therefore an object of the invention to provide an inexpensive semiconductor light emitting device and its manufacturing method, which permits a lens to be made easily, and is improved in adherability and humidity resistance between the resin encapsulating element and the resin stem, and also improved in reflecting efficiency and light take-out efficiency.

According to the invention, there is provided a semiconductor light emitting device comprising: a semiconductor light emitting element made by using GaP, GaAlAs, GaAsP, InGaAlP, GaN, ZnSe, SiC, BN, for example; a resin stem having a first lead, a second lead and a resin portion partly covering the first and second leads, one end of the first lead and one end of the second lead being externally extended from the resin portion, and the resin stem having a recess containing the semiconductor light emitting element, the other end of the first lead electrically connected to a first electrode of the semiconductor light emitting element, and the other end of the second lead electrically connected to a second electrode of the semiconductor light emitting element; a light-transmissive resin filling the recess of the resin stem; and a projection made of a light-transmissive resin to cover the entire upper surface of the resin stem, the projection extended down onto side surfaces of said resin stem to a predetermined level from the upper surface to continuously cover the upper part of the side surfaces all around.

The resin stem may have at least one through hole in the bottom of the recess or at least one through hole extending from the upper surface to the lower surface. The projection may form a lens having a vertical axis aligned with a vertical axis of the resin stem, and these center axes may be aligned with a vertical axis of the semiconductor light emitting element. The semiconductor light emitting device may include a fluorescent element for converting light emanating from the semiconductor light emitting element into different wavelength light. The fluorescent element may be contained in the resin portion of the resin stem, may be applied onto inner wall surfaces of the recess of the resin stem, or may be contained in a mounting adhesive applied onto the bottom surface of the semiconductor light emitting element, in the light-transmissive resin filling the recess, or in the light-transmissive resin forming said projection.

The recess of the resin stem may be longer in a first horizontal direction in which the first and second leads extends than in a second horizontal direction normal to the first direction. The first electrode of the semiconductor light emitting element may be connected to the first lead by a bonding wire, and the second electrode of the semiconductor light emitting element may be connected to the second lead by another bonding wire. The center of a horizontal cross-sectional configuration of the recess of the resin stem may be offset from the center of a horizontal cross-sectional configuration of the resin stem. The second electrode of the semiconductor light emitting element may be connected to the second lead by a bonding wire, and the center of a horizontal cross-sectional configuration of the recess of the resin stem may be offset from the center of a horizontal cross-sectional configuration of the resin stem toward the externally extending direction of the second lead. Inner side surfaces of the recess may serve as reflective surfaces.

The resin portion of the resin stem is made from a thermoplastic resin not less than 65 weight % and a filler agent not more than 35 weight %, the filler agent being a high reflective material containing titanium oxide, silicon oxide, and/or aluminum oxide, and titanium oxide occupying 10 to 15 weight %.

There is also provided a method for manufacturing a semiconductor light emitting device comprising the steps of: forming a resin stem by integrally molding a lead frame having first and second leads and a resin portion such that the first and second leads be positioned in an end-to-end alignment in a recess formed in the upper surface of the resin portion; mounting a semiconductor light emitting element having first and second electrodes in the recess, and electrically connecting the first lead to the first electrode and the second lead to the second electrode; injecting a fluid-state thermosetting resin into an encapsulating case mold; dipping the upper surface of the resin stem and upper parts of side surfaces continuous from the upper surface into the fluid-state resin in the encapsulating case mold; and hardening the fluid-state resin to form a projection of a light-transmissive resin on the resin stem, in which the projection covering the entire upper surface of the resin stem, and extended down onto side surfaces of the resin stem to a predetermined level from the upper surface to continuously cover the upper part of the side surfaces all around.

According to the invention, there is provided an alternative method for manufacturing a semiconductor light emitting device comprising the steps of: forming a resin stem by integrally molding a lead frame having first and second leads and a resin portion such that the first and second leads are positioned in an end-to-end alignment in a recess formed in the upper surface of the resin portion; mounting a semiconductor light emitting element having first and second electrodes in the recess, and electrically connecting the first lead to the first electrode and the second lead to the second electrode; injecting a first fluid-state thermosetting resin into the recess to embed the semiconductor light emitting element and the first and second leads; injecting a second fluid-state thermosetting resin into an encapsulating case mold (11); dipping the resin stem into the second fluid-state resin within the encapsulating case mold by bringing the first fluid-state resin into touch with the second fluid-state resin in the encapsulating case mold; hardening the first and second fluid-state resins to form a light-transmissive resin encapsulating element in the recess and a projection of a light-transmissive resin on the resin stem, in which the projection covers the entire upper surface of the resin stem, and extends down onto side surfaces of the resin stem to a predetermined distance from the upper surface to continuously cover the upper part of the side surfaces all around.

The resin stem may be oriented upside down when dipped into the second fluid-state resin within the encapsulating case mold. The resin stem may be dipped into the second fluid-state resin within the encapsulating case mold to a depth where the lead frame contacts the edge of the cavity of the encapsulating case mold. The encapsulating case mold may have a stopper along the edge of the cavity thereof, and the resin stem may be dipped into the second fluid-state resin within the encapsulating case mold to a depth where the lead frame contacts the stopper. Alternatively, the resin stem may have a stopper, and may be dipped into the second fluid-state resin within the encapsulating case mold to a depth where the lead frame contacts the stopper. The lead frame may include plural pairs of the first and second leads. The encapsulating case mold may be a part of a case mold chain which includes a plurality of encapsulating case molds aligned in a row. A plurality of resin stems may be formed for individual lead pairs of the lead frame, and they may be dipped into corresponding individuals of the encapsulating case molds of the case mold chain. The first fluid-state resin and the second fluid-state resin may be different resin materials. Ultraviolet rays may be irradiated onto the resin stem before the fluid-state resin is injected into the recess of the resin stem.

According to the invention, there is further provided a semiconductor light emitting device comprising: a semiconductor light emitting element; a resin stem supporting the semiconductor light emitting device, one end of an externally extended first lead electrically connected to a first electrode of the semiconductor light emitting element, one end of an externally extended second lead electrically connected to a second electrode of the semiconductor light emitting element, and a bonding wire connecting the second electrode to the second lead; and a light transmissive resin encapsulating element embedding the semiconductor light emitting element, the ends of first and second leads connected to the first and second electrodes, and the bonding wires, in which the resin stem is composed of a thermoplastic resin not less than 65 weight % and a filler agent not more than 35 weight % titanium which contains 10 to 15 weight % of titanium oxide and/or one or more of other high reflective materials selected from silicon oxide, aluminum oxide, and so on.

In the semiconductor light emitting device according to the invention, since the projection of a light-transmissive resin is formed on the resin stem to envelope its upper surface and upper part of the side surfaces continuous from the upper surface, the adherability between the projection and the resin stem is improved. Ultraviolet irradiation improves the coupling force of the resin stem of a thermoplastic resin with a thermosetting light-transmissive resin. By aligning the semiconductor light emitting element with vertical center lines of the projection and the resin stem and by deviating the center of recess from the center of the resin stem, the light emitting efficiency is improved. The through hole formed in the resin stem facilitates coupling of the light-transmissive resin to the resin stem. The stopper keeps the projection distant from the lead frame (leads).

The above-summarized constructions of the present invention remarkably increase the adherability between the projection of a light-transmissive thermosetting resin and the resin stem of a thermoplastic resin, and contributes to realization of an economical resin stem with a high reflective index. Moreover, the invention can cope with various applications by varying the lead forming configuration. Additionally, various semiconductor light emitting devices with different optical characteristics can be prepared by changing the encapsulating case mold.

DETAILED DESCRIPTION OF THE PREFERRED EMBODIMENTS

Figure 1:
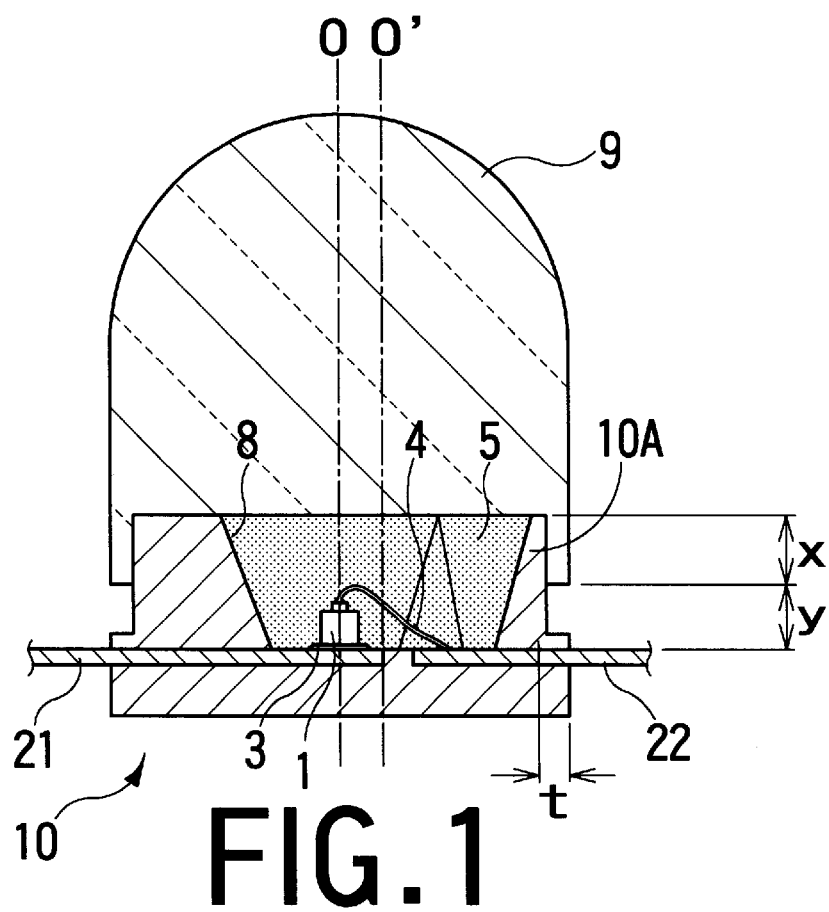
FIG. 1 is a cross-sectional view of a semiconductor light emitting device according to an embodiment of the invention (taken along the A–A' line of FIG. 2)
Figure 2:
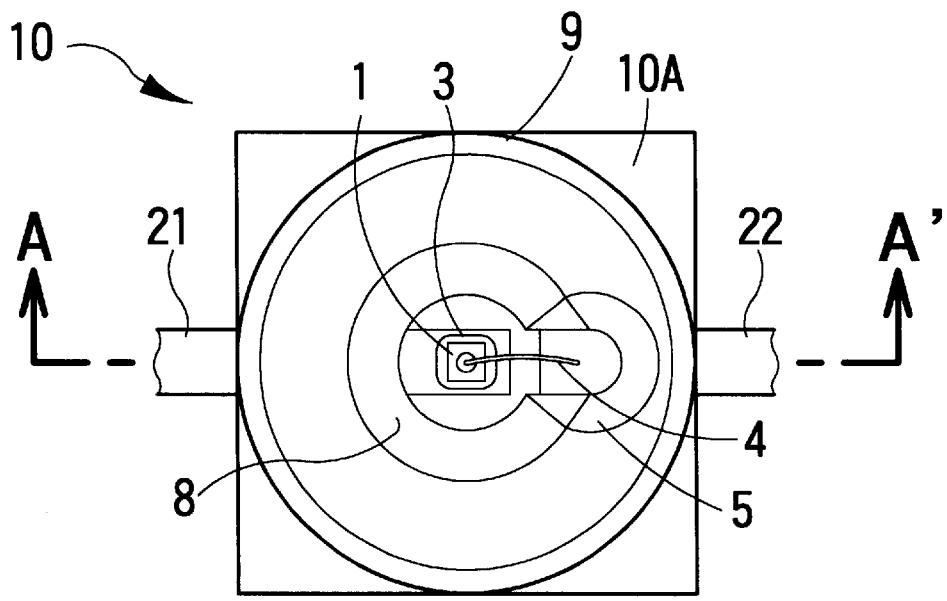
FIG. 2 is a plan view of the semiconductor light emitting device according to the invention.
Figure 3:
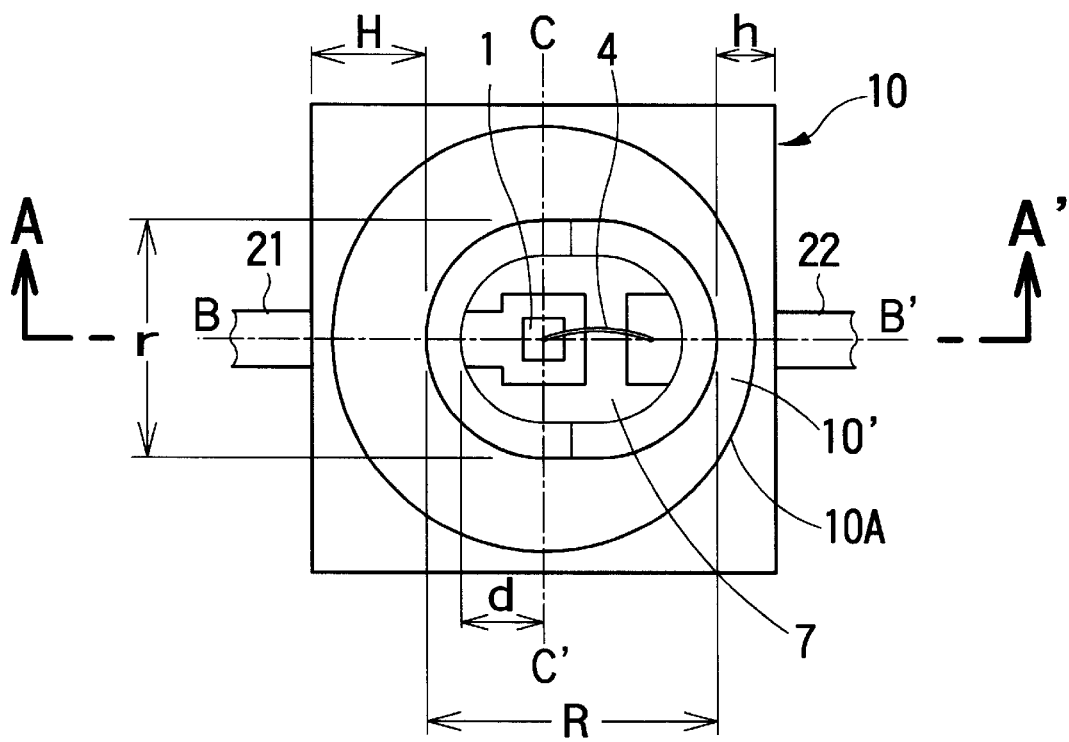
FIG. 3 is a simplified plan view of a resin stem used in the invention.
Figure 4:
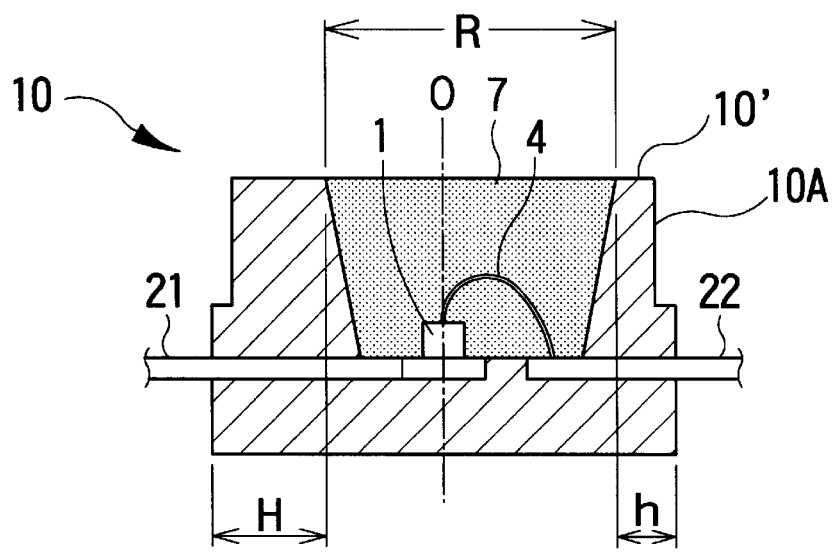
FIG. 4 is a cross-sectional view taken along the A–A' line of FIG. 3.

Explained below are embodiments of the present invention with reference to the drawings. Referring to FIGS. 1 through 4 showing a first embodiment, FIG. 1 is a cross-sectional view of a semiconductor light emitting device, and FIG. 2 is a plan view of the same semiconductor light emitting device. FIG. 1 is taken along the A–A' line of FIG. 2. FIG. 3 is a simplified plan view of a resin stem for explaining the position of the resin stem in the semiconductor light emitting device, and FIG. 4 is a cross-sectional view taken along the A–A' line of FIG. 3.

As shown in FIG. 1, the resin stem 10 has leads 21 and 22, made by molding a lead frame, and a resin portion 10A, which is an integral molded product. The resin portion 10A includes a recess which opens to the upper surface thereof with a larger area than its bottom and has slanted side walls behaving as reflective surfaces 8. The resin portion 10A of the resin stem 10 comprises a generally square lower portion and a generally circular upper portion having the recess. End portions of leads 21, 22 lie on the bottom surface of the recess in an end-to-end confrontation. Opposite end portions of the leads 21, 22 extend in the opposite directions to the exterior of the resin portion 10A. These leads 21, 22 are molded in a cut-and-forming step of the lead frame. A semiconductor light emitting element 1 made of GaP, GaAlAs, GaAsP, InGaAlP or GaN, for example, has first and second electrodes (not shown), and is mounted at the lead 21 on the bottom surface of the recess by Ag paste 3, for example.

The second electrode of the semiconductor light emitting element 1 is connected to the lead 22 by a bonding wire 4 of Au, for example. A thermosetting resin fully fills the recess of the resin portion 10A to form a light-transmissive resin encapsulating element 5. A projection 9 of a light-transmissive resin encapsulating element made of a thermosetting resin is formed on the resin stem 10. The projection 9 is used as a lens, for example. The projection 9 covers the entire upper surface of the resin stem 10 including the surface of the resin encapsulating element 5 and an upper part of the side surfaces continuous from the upper surface. The semiconductor light emitting element 1 in the recess is located along a vertical center line 0 of the projection 9. The center line 0 is common to the vertical center line of the resin stem 10. However, the recess is eccentric from the center of the upper surface of the resin stem 10, and the vertical center line 0' of the recess does not coincide with the center line 0. This construction results in locating the semiconductor light emitting element 1 closer to the reflective surfaces 8 and in making the reflective surfaces 8 more effective to improve the light take-out efficiency. The projection 9 is larger than the diameter of the upper portion of the resin stem 10 by the thickness t so as to cover the entirety of the upper side surface of the resin stem 10 (length x). The projection 9 does not contact the lead 21 or 22, and is distant from the leads 21 and 22 by a predetermined distance y.

In this embodiment, the thickness t of the projection 9 on the side surface of the resin stem is approximately 2 mm when the length of one side of the resin portion 10A is either 2.4 mm or 4.5 mm. When manufacturing the semiconductor light emitting device, after mounting the projection 9 on the resin stem 10, a lead frame is cut and formed into the form of leads 21 and 22 to complete the semiconductor light emitting device. The leads 21 and 22 may be formed into a gull wing, J-bent or other appropriate shape.

The structure of the resin stem of the semiconductor light emitting device shown in FIG. 1 is explained in greater detail with reference to FIGS. 3 and 4 which are a simplified plan view and a cross-sectional view of the resin stem supporting the semiconductor light emitting element, removing the projection for clearly illustrating the position of the semiconductor light emitting element. The resin portion 10A of the resin stem 10 is generally square or rectangular (approximately as large as 3.0×3.4 mm or 5.0× 5.4 mm, for example), and the upper portion including the upper surface 101 is cylindrical. The B–B' line and the C–C' line in FIG. 3 are center lines of two pairs of parallel sides. The vertical center line 0 of the resin stem 10 is shown in FIG. 4. As stated above, the upper surface 10' of the resin stem 10 is generally circular, and the recess 7 formed therein is substantially elliptic (with the longest diameter R and the shortest diameter r). The leads 21 and 22 extend in opposite directions from their confronting ends, and extend to the exterior of the resin stem 10 through its opposite sides. The semiconductor light emitting element 1 is located in the recess 7 to overlap all of the center lines B–B', C–C' and 0. The recess 7 is not in the center on the upper surface of the resin stem 10 and offset toward the lead 22 along the lead-extending direction (the distance H from the side crossing with the lead 21 to the recess is larger than the distance h from the side crossing with the lead 22 to the recess).

The purpose of the offset location of the recess is to amply reserve the region for the bonding wire. That is, this structure decreases distances between the reflective surfaces 8 and the semiconductor light emitting element 1 than the conventional structure shown in FIGS. 23 and 24 while providing an ample region for the bonding wire. Also in the conventional structure shown in FIGS. 23 and 24, the semiconductor light emitting element 1 is located to overlap the center lines B–B', C–C' and 0. However, since the recess 7 is formed in the center of the resin stem 10, a the recess 7 necessarily becomes larger to provide an ample area for the bonding wire 4. Also through comparison between FIG.

Figure 23:
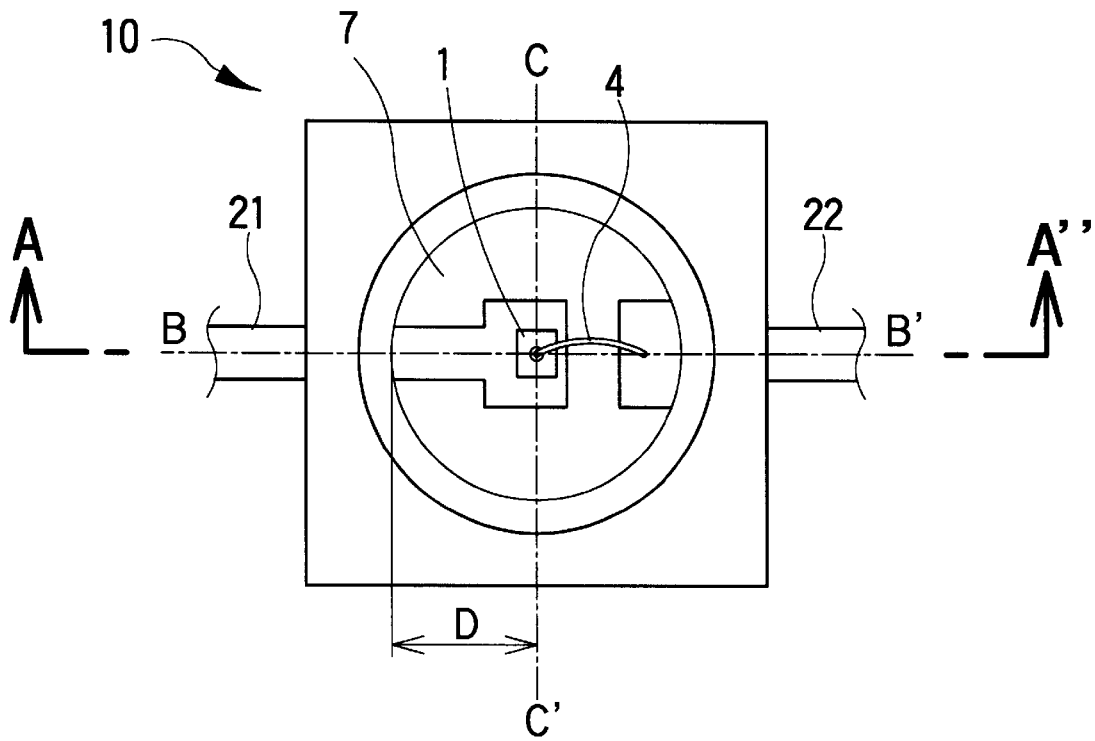
FIG. 23 is a plan view of a conventional resin stem.
Figure 24:
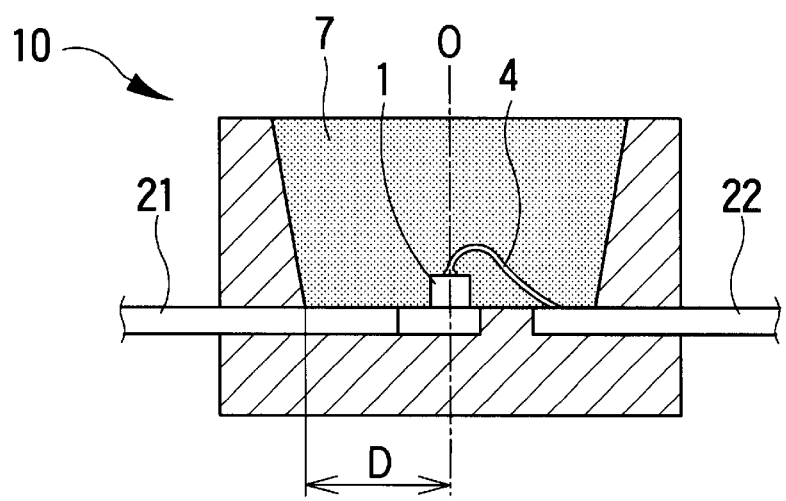
FIG. 24 is a cross-sectional view taken along the A–A' line of FIG. 23.

3 and FIG. 23, the recess in FIG. 23 is apparently larger than the recess of FIG. 3 (the size of the resin stem itself is equal as shown in FIGS. 3 and 23). That is, the distance from the circumference of the bottom of the recess 7 to the semiconductor light emitting element 1 is smaller in this embodiment than that of the conventional structure (D>d).

As explained above, the invention can locate the semiconductor light emitting element 1 closer to the reflective surfaces 8 than the conventional structure, and can use the reflective surfaces 8 more effectively. That is, the invention ensures that more light be reflected by the reflective surfaces 8 and taken out to the exterior. As a result, the light take-out efficiency is improved.

The light-transmissive resin encapsulating element used in the invention to form the projection 9 is made of a thermosetting resin whereas the resin portion 10A of the resin stem 10 is made of a thermoplastic resin. Therefore, adherability of them is generally not good. In the present invention, however, since the light-transmissive resin encapsulating material forming the projection 9 and covering the upper surface of the resin portion 10A hangs down onto an upper part of the side surface, the adhering strength between the resin stem and the light-transmissive resin encapsulating material is improved. Therefore, the humidity resistance of the device is improved, and thermal stress-cracking is decreased.

Moreover, since the resin portion 10A is molded to embed the lead frame, surfaces of the resin stem 10 can be aligned easily, and the lead frame can be easily handled. Additionally, the semiconductor light emitting device can be mounted easily when incorporated into a set.

Figure 5:
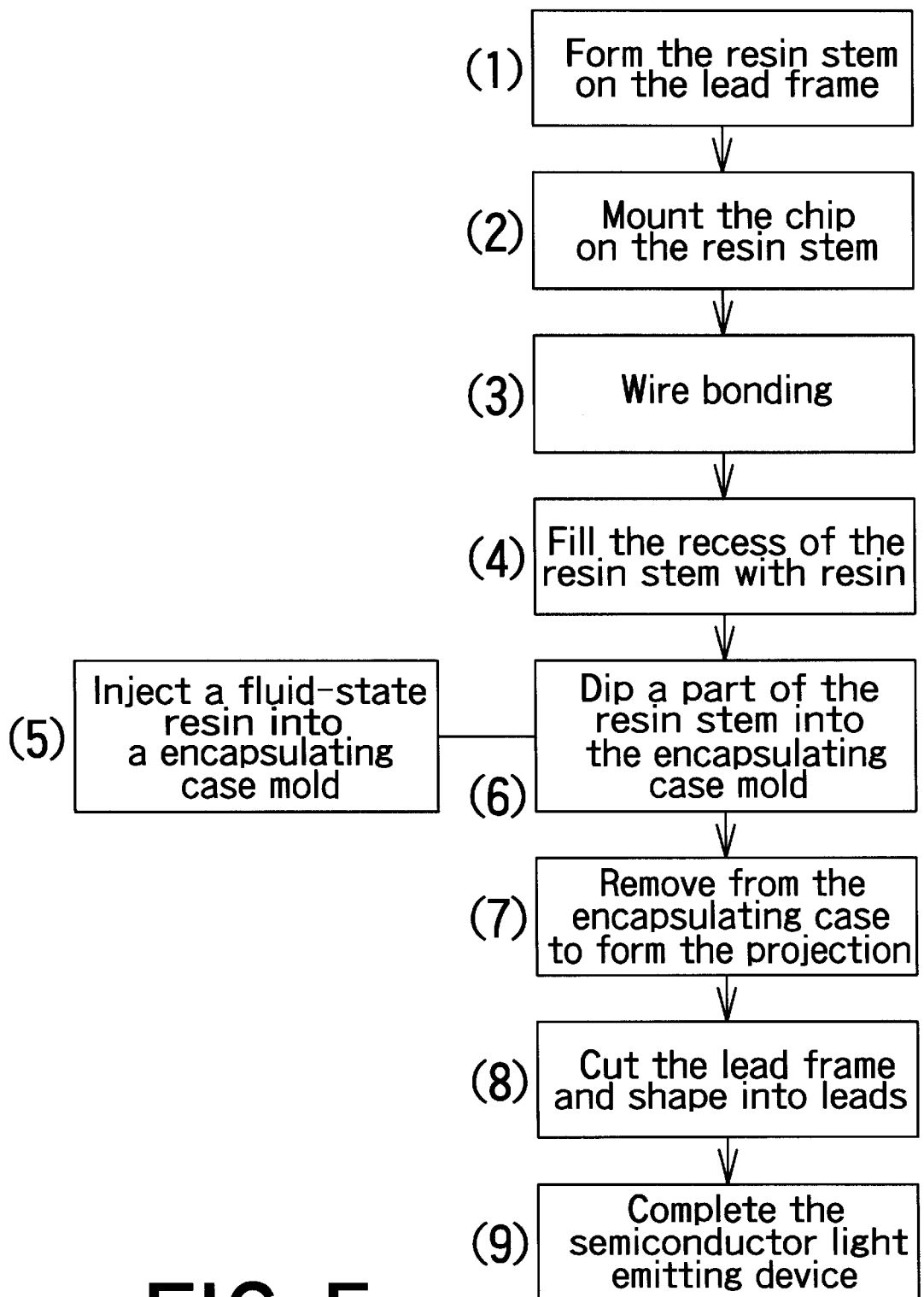
FIG. 5 is a flow chart of a manufacturing process of the semiconductor light emitting device according to the invention.
Figure 6:
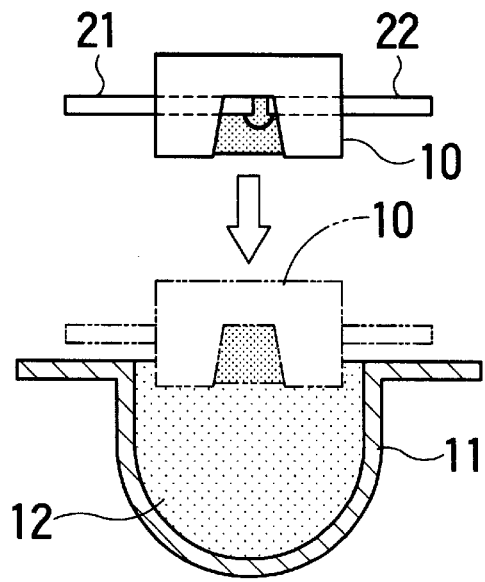
FIG. 6 is a cross-sectional view of an encapsulating case mold and a resin stem used in the invention.

Next explained is a method for manufacturing the semiconductor light emitting device according to the invention. FIGS. 5 through 8B illustrate a method for manufacturing a semiconductor light emitting device according to the first embodiment of the invention. FIG. 5 is a flow chart of the manufacturing process, FIGS. 6, 7A and 7B are cross-sectional views of the device in different steps during the process for making the projection of a light-transmissive resin, and FIGS. 8A and 8B are cross-sectional and plan views of the resin portion of the resin stem.

The following steps are executed for manufacturing the semiconductor light emitting device shown in FIG. 1. First of all, the lead frame is set in a resin mold, and a thermoplastic resin is applied into the cavity by injection molding, for example. It results in obtaining the resin stem 10 including the resin portion 10A made of the thermoplastic resin (FIG. 5(1)). The resin stem has formed a recess on its upper surface. Leads in the lead frame are placed in the recess in a predetermined direction. A light emitting element 1 (hereinafter called a chip) is mounted on one of the leads by bonding the lead to the first electrode of the chip with Ag paste, for example (FIG. 5(2)). Connected to the second electrode of the chip is one end of a bonding wire, and the other end of the bonding wire is connected to the other lead (FIG. 5(3)). Next supplied is a thermosetting resin into the recess containing the chip (FIG. 5(4)). On the other hand, a fluid-state resin is injected into a encapsulating case mold (FIG. 5(5)). Then, a part of the resin stem including its upper surface is dipped into the encapsulating case mold (FIG. 5(6)). This step of the process is explained with reference to FIG. 6.

The encapsulating case mold 11 contains the injected fluid-state resin 12. The resin stem 10 oriented upside down is progressively dipped into the fluid-state resin from its upper surface until the leads 21 and 22, serving as a stopper, hits the encapsulating case mold 11. The resin stem 10 is held there, with the leads 21 and 22 contacting the encapsulating case mold 11, until the resin sets. When the resin sets and the projection 9 is formed, the product is removed from the encapsulating case mold (FIG. 5(7)). Although this embodiment does not use, a parting agent may be previously applied onto the inner surface of the encapsulating case mold. The projection 9, thus made, may be used as a lens, for example. After that, the lead frame is cut and shaped into leads of a predetermined configuration (FIG. 5(8)). Then, after a test of the semiconductor light emitting device, additional treatment is done to complete the semiconductor light emitting device (FIG. 5(9)).

Figure 7A:
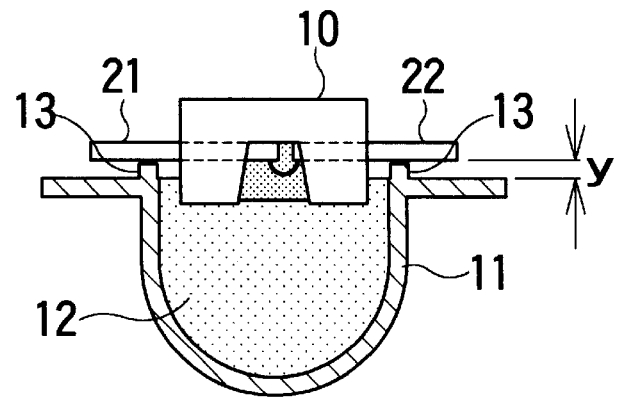
FIGS. 7A and 7B are a cross-sectional view and a plan view of the encapsulating case mold used in the invention respectively.
Figure 7B:
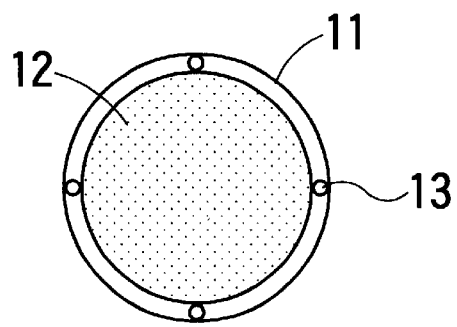
Figure 8A:
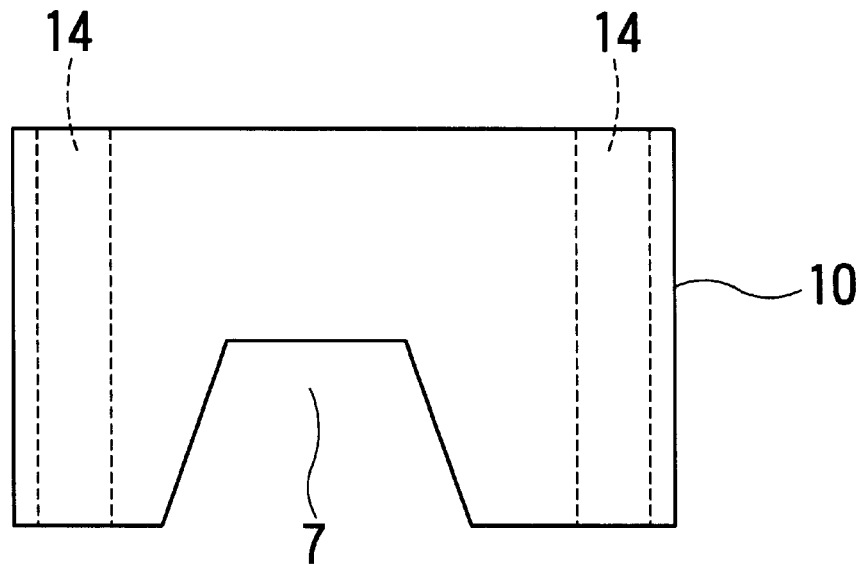
FIGS. 8A and 8B are an elevaion view and a plan view of the resin portion of the resin stem used in the invention respectively.
Figure 8B:
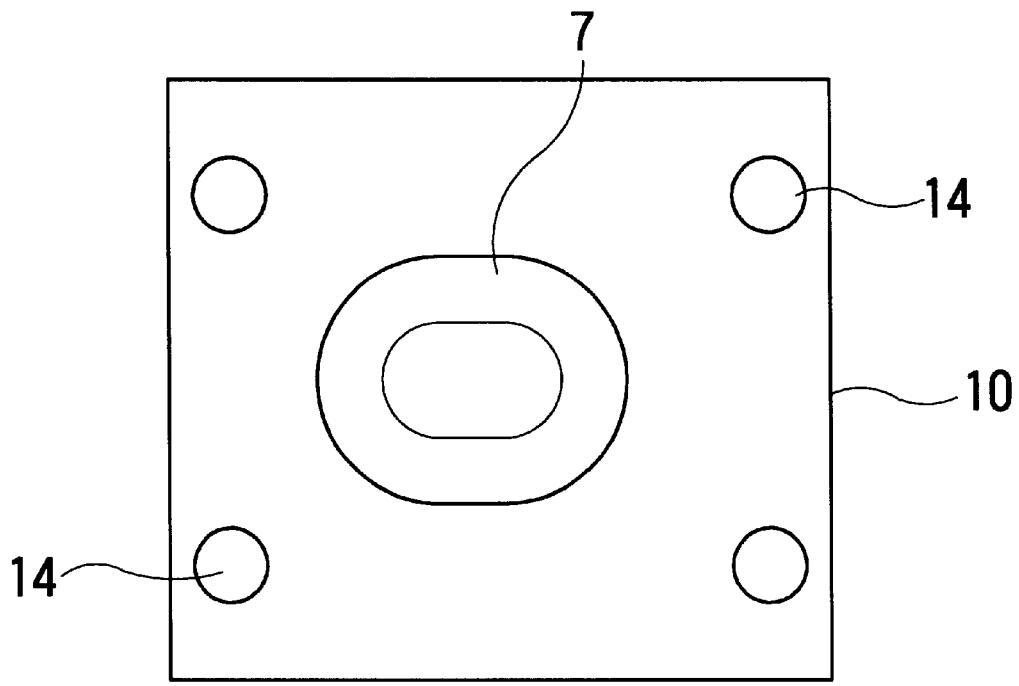

FIGS. 7A and 7B show a second version of steps (6) and (7). In this case, the encapsulating case mold 11 has at least one projection 13 along the edge of its recess to serve as a stopper. When the resin stem 10 comes down, the leads 21 and 22 engage the projection 13. That is, since the leads do not directly hit the encapsulating case mold, it is prevented that the fluid-state resin flows out (leakage of resin) through between the leads and the encapsulating case mold by capillarity. The semiconductor light emitting device shown in FIG. 1 has been made in this process, and the bottom surface of the projection 9 is distant from the leads by a predetermined distance y. The distance y corresponds to the height y of the projection 13 of the encapsulating case mold 11. The spacer between the leads and the encapsulating case mold may be formed on the resin stem instead of the encapsulating case mold as illustrated. Particular consideration must be taken on the position of the projection 13 relative to the encapsulating case mold in order to ensure that the leads (lead frame) do not contact with the fluid-state resin when the resin stem 10 is dipped into it.

FIGS. 8A and BB show a third version of steps (6) and (7). In this process, at least one through hole 14 is formed in the resin stem 10 excepting the region of the recess. In the example illustrated in FIGS. 8A and 8B, one through hole 14 for each corner of the resin stem 10, namely four through holes in total, are formed. The through holes serve as escape holes for an excessive amount of the injected fluid-state resin to escape from the encapsulating case mold when the resin stem is dipped into the resin.

Next explained is a semiconductor light emitting device taken as the second embodiment of the invention.

Figure 9A:
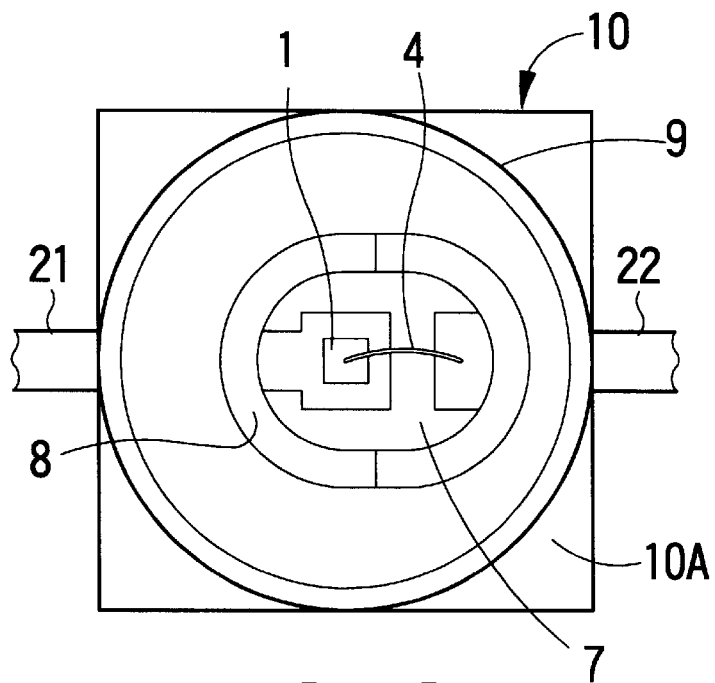
FIGS. 9A and 9B are a plan view and a cross-sectional view of a semiconductor light emitting device according to the invention respectively.
Figure 9B:
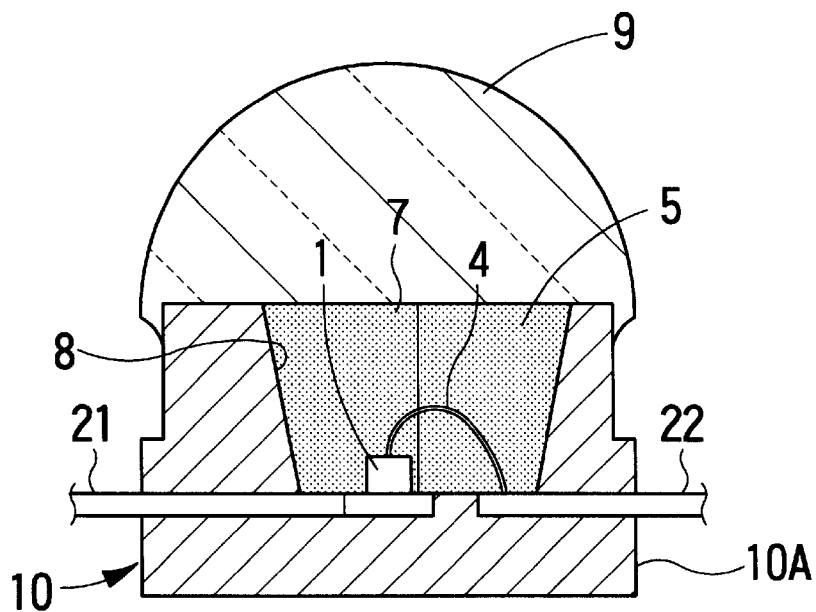
Figure 10:
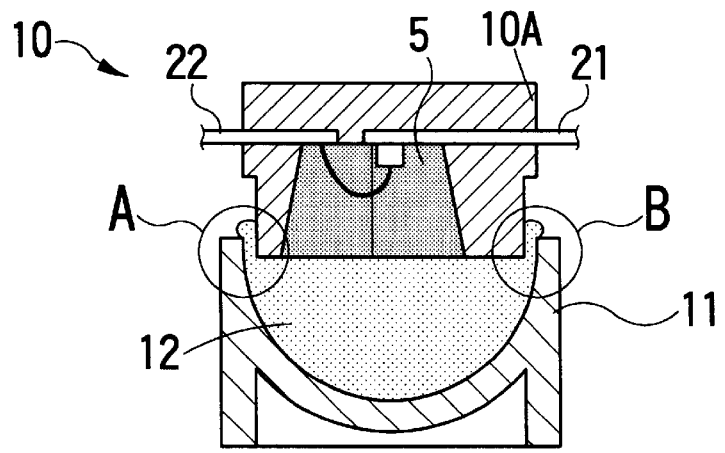
FIG. 10 is a cross-sectional view of an encapsulating case mold and a resin stem used in the invention.

FIGS. 9A and 9B are plan and cross-sectional views of the semiconductor light emitting device, and FIG. 10 is a cross-sectional view of the semiconductor light emitting device for explaining its manufacturing method. The semiconductor light emitting device shown in FIGS. 9A and 9B is similar to that of FIG. 1 in construction. Namely, a semiconductor light emitting element 1 is mounted on the resin stem 10, a resin encapsulating element 5 of a light-transmissive resin packs it, and a lens-shaped projection 9 of a light-transmissive resin is formed on the upper surface of the resin stem 10 containing the resin encapsulating element 5. Since the projection 9 covers the upper surface of the resin stem 10 and the side surface continuous from the upper surface, the adherability of the resin stem 10 and the projection 9 is high. The semiconductor light emitting element 1 is aligned with the vertical center axis of the projection 9 and the resin stem 10. In order to increase the light take-out efficiency, the recess of the resin stem 10 is eccentric from the center in a direction closer to the edge from which the lead 22 extends to the exterior (in a direction remoter from the edge from which the lead 21 extends to the exterior). That is, the structure provides an ample area for the bonding wire while shortening distances between the semiconductor light emitting element 1 and the reflective surfaces 8.

To form the projection 9, a thermosetting resin is injected into both a encapsulating case mold 11 and the recess 7 of the resin stem 10. Before the thermosetting resin sets, the resin stem 10 is dipped into the fluid-state resin 12 in the encapsulating case mold 11 from its upper surface. In this manner, even if the resin contracts while it sets, part of the resin existing between the encapsulating case mold 11 and the resin stem 10 (at regions A and B in FIG. 10) compensates or absorbs it. Therefore, the projection 9 can holds its shape of a lens also after setting of the resin, and shortage of resin does not occur at the bonding area with the resin stem 10.

Moreover, the resin stem 10 need not be intentionally hit to the encapsulating case mold to prevent leakage of the resin to the exterior before it sets. Therefore, this embodiment does not require particular attention on the pressure for hitting the resin stem 10 to the encapsulating case mold 11, and permits a low accuracy in relative dimension between the encapsulating case mold 11 and the resin stem 10. That is, the embodiment permits a low relative dimensional accuracy between different parts, and makes the manufacturing process easier.

Figure 11:
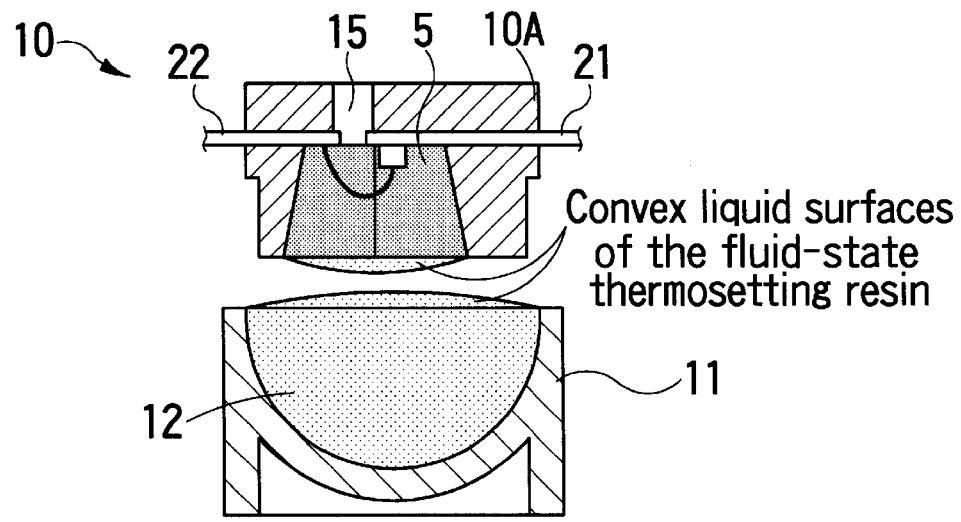
FIG. 11 is a cross-sectional view of the encapsulating case mold and the resin stem used in the invention.

Next explained is another method for manufacturing the semiconductor light emitting device according to the invention with reference to FIG. 11 which is a cross-sectional view of the semiconductor light emitting device shown in FIG. 9 in a step of the manufacturing process. When the resin stem 10 is brought onto the fluid-state resin 12 in the encapsulating case mold 11, air may enter between them in form of bubbles. This embodiment intends to prevent such bubbles and can make a high-quality resin encapsulating element. Namely, a fluid-state thermosetting resin is injected into both the encapsulating case mold 11 and the recess 7 of the resin stem 10. Amounts of the resin are adjusted to form convex liquid surfaces. In this status, the resin stem 10 is inserted from its upper surface into the fluid-state resin 12 in the encapsulating case mold 11. Contact of both fluid-state resins begins from their convex centers and progressively extends toward their radially outward regions. Therefore, it is prevented that air is confined in form of bubbles between both resins. In this case, it is not necessary that both liquid surfaces be convex. Even when one of the liquid surfaces is convex and the other is flat or slightly concave, the same effect will be obtained. Also when a through hole 15 is formed in the recess of the resins stem 10 to release bubbles, a similar result is obtained.

Next explained is a semiconductor light emitting device taken as the third embodiment of the invention. Heretofore, the following technical problems have been recognized and desired to overcome in the field of surface-packed semiconductor light emitting devices. (1) Due to a structure making it difficult to form a lens, the device has a low luminance. Moreover, due to variance in amount of resin, setting contraction of epoxy resin, etc., the resin surface becomes convex, and the luminance varies largely. (2) The distance between the semiconductor light emitting element and the stem reflective surface is long, in general, and the effect of the reflective plate is small especially in a InGaAlP compound semiconductor light emitting device where the active layer is close to the surface of the element. (3) Since an epoxy resin of a low Tg(glass transition temperature) is used, the epoxy resin used as the resin encapsulating element applies a resin stress to the bonding wire (Au wire) upon changes in ambient temperature, and accelerates breakage of the wire. (4) Low Tg epoxy resins have low crosslinking densities after being set, and are weak in humidity resistance.

On account of the conventional semiconductor light emitting device, the semiconductor light emitting device according to the embodiment can remarkably alleviate the resin stress to the semiconductor light emitting element and the Au wire upon changes in ambient temperature by forming the projection of a light-transmissive resin on the resin stem 10 in the same manner as the embodiment of FIG. 1 and by additionally applying a silicone resin into the recess of the resin stem 10. Moreover, the reflective plate 8 of the resin stem 10 is positioned higher and closer to the semiconductor light emitting element 1 to reflect light from the side surface of the element upward and to improve the optical output. Further, the embodiment provides a high-output high-quality semiconductor light emitting device having a parabolic reflective plate.

Figure 12:
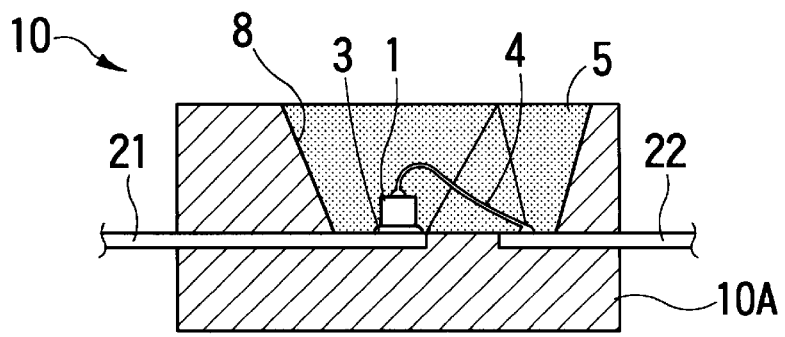
FIG. 12 is a cross-sectional view of the resin stem used in the invention.

With reference to FIG. 12, a method for manufacturing the semiconductor light emitting device is explained below. First of all, the resin stem 10 is made by injection-molding a high heat-resistant thermoplastic resin, such as liquid crystal polymer (LCP), SPS, PPS, onto leads 21 and 22 prepared in form of a iron (Fe)- or copper (Cu)-based lead frame. After that, the resin stem 10 is treated by ultraviolet radiation, and the semiconductor light emitting element 1 is bonded to the resin stem 10 with Ag paste 3 by heating it to 200° C. for two hours, approximately. Then, the semiconductor light emitting element is connected to the lead 22 with a Au wire 4 of a diameter of 25 to 30 $\mu$m. After that, a light-transmissive silicone resin is poured onto the resin stem 10 to cover the entirety of the semiconductor light emitting element 1 and the Au wire 4, and it heated at 150° C. for five hours, approximately, to form the encapsulating element 5. Next, although not shown, a projection of a light-transmissive resin for use as a lens is formed on the resin stem 10 in the same manner as the first embodiment, and it is heated and set at 125° C. for six hours, approximately. Then, appropriate coverage is made onto outer parts of leads 21 and 22 by solder, Sn or Au, and they are cut to remove excessive portions to complete the device.

Figure 22:
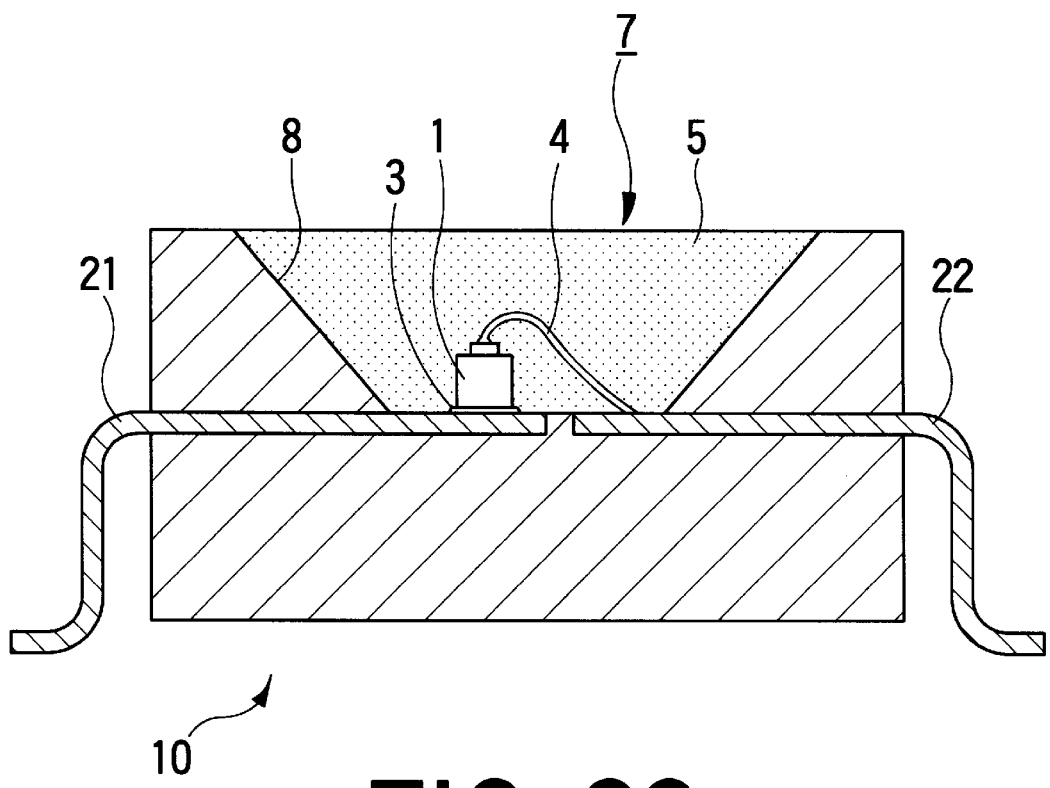
FIG. 22 is a cross-sectional view of a conventional semiconductor light emitting device.

FIG. 12 is a cross-sectional view of the resin stem having mounted the semiconductor light emitting element. As shown, the reflective surface is made closer to the semiconductor light emitting element 1 and higher than in the conventional device (see FIG. 22) to use the light emitted from the side surface of the light emitting element as part of the externally emitted light (in case of the side-surface emitted light, since the intensity distribution of the light emitted from the side of the element 1 according to the Lambert's law originating from the active layer is localized, the take-out efficiency of the light increases as the reflective surface becomes higher and nearer to the light emitting element). Although the illustrated reflective surface is cone-shaped, a parabolic reflective surface exhibits a higher reflective effect.

The material used in the embodiment for encapsulating the recess of the resin stem 10 is a light-transmissive silicone resin. The use of a silicone resin remarkably decreases the resin stress. That is, since a conventional low-Tg epoxy resin applies a stress to the Aug wire 4 upon thermal expansion or contraction of the epoxy resin caused by changes in ambience temperature, the Au wire 4 is liable to break by fatigue in long-term temperature cycles (approximately 100 cycles). In contrast, in this embodiment where the semiconductor light emitting element 1 and the Au wire 4 are entirely covered by the silicone resin 5, the resin stress of the encapsulating element 5 is remarkably reduced, and the stress from the projection 9 (see FIG. 1) is substantially removed (although the silicone resin thermally expands and contracts, its stress is negligibly small).

Further, in the conventional device, a low-Tg epoxy resin has been used on account of a low adherability of the epoxy resin to the stem of a thermoplastic resin. In the embodiment, however, irradiation of ultraviolet rays onto the resin stem as explained above activates the resin surface, improves the adherability even of a high-Tg epoxy resin, and can significantly improve the humidity resistance of the semiconductor light emitting device.

Moreover, a Fe- or Cu-based lead frame used in the embodiment contributes to a reduction of the cost, and also the in-line step of forming the resin stem integrally with the lead frame contributes to providing an economical semiconductor light emitting device.

Additionally, since the embodiment uses a lens-shaped case mold, the light emitted from the light emitting element is converged, and hence improves the luminance remarkably. Further, the structure is usable to various applications by varying the lead forming configuration, and semiconductor light emitting devices having various optical characteristics can be prepared by changing the encapsulating case mold.

Figure 13:
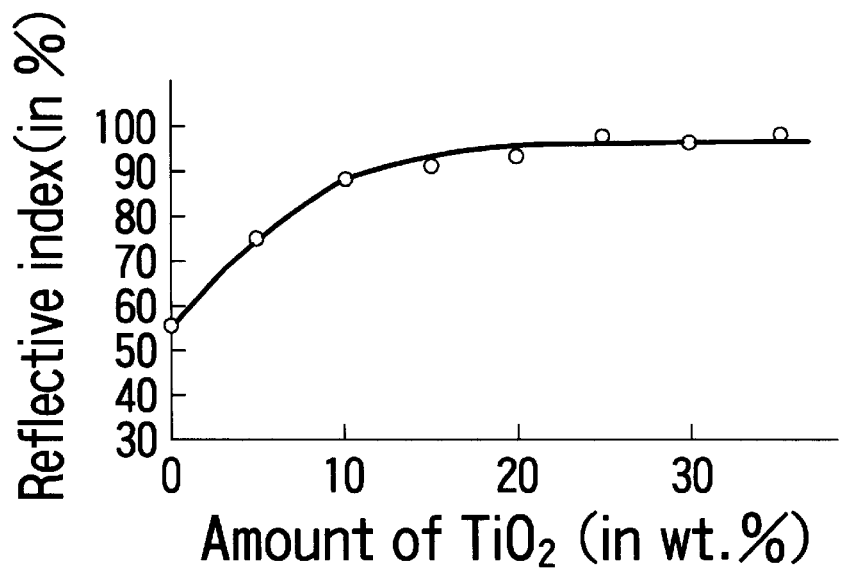
FIG. 13 is a diagram showing changes in reflective index with composition ratio of titanium oxide.
Figure 14:
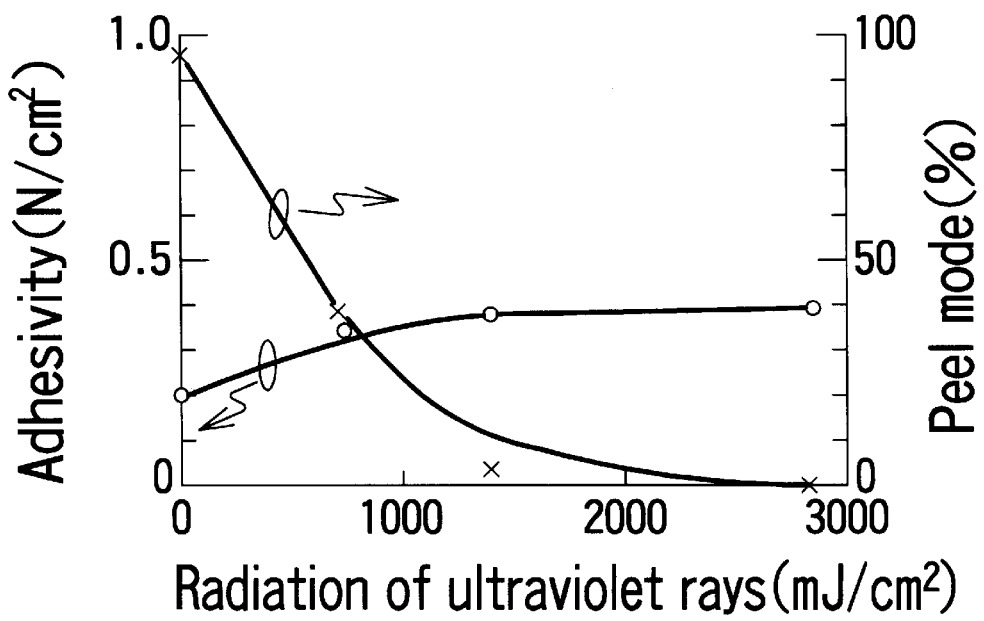
FIG. 14 is a diagram showing changes in adherability with ultraviolet radiation.

Next explained is another embodiment of the invention with reference to FIGS. 13 and 14. A typical filler agent contained in the thermoplastic resin forming the conventional resin stem is silica ($SiO_2$). It results in a low reflective index and a low optical output. Moreover, epoxy resins and other thermosetting resins, in general, have no chemical bonds with thermoplastic resins, and their adherability is weak. Moreover, since a low-Tg epoxy resin is used, the humidity resistance is not good.

This embodiment, however, improves the composition of the resin portion 10A of the resin stem 10 used in the semiconductor light emitting device shown in FIG. 1. That is, in this embodiment, (1) the resin stem having a reflective plate made of a thermoplastic resin and a filler agent contains the thermoplastic resin not less than 65 wt. % and the filler agent less than 35 wt. %, and the filler agent contains titanium oxide not more than 20 wt. % and aluminum oxide. (2) Used as the thermoplastic resin is a high heat-resistant resin such as liquid crystal polymer (LCP). (3) Ultraviolet rays are irradiated onto the molded resin stem.

A method for manufacturing the device is summarized below. First prepared is a Fe-based or Cu-based metal plate-shaped lead frame, such as NSD, as thin as 0.1 to 0.2 mm. Next, the resin stem 10 is injection-molded on the lead frame by using a high heat-resistant thermoplastic resin such as LCP, PPS, SPg containing $TiO_2$, as the major component, and a filler agent. After the semiconductor light emitting element 1, made of GaP, for example, is mounted on the resin stem 10 with conductive paste 3 (at 200° C. for two hours, approximately), wire bonding is done using a bonding wire (Au wire) 4 with a very small diameter (25 to 30 $\mu$m). After that, a light-transmissive epoxy resin is injected into the recess 7 of the resin stem 10 (the vertical wall of the recess serves as the reflective surface), and is held under 120° C. for eight hours, approximately, to thermally harden it. Thus, the encapsulating element 5 is obtained (see FIG. 12). After that, the projection 9 of the same material as the encapsulating element 5 is formed on the resin stem 10 by any one of the methods explained before. Then, appropriate coverage is made onto externally extended portions of the leads frame by solder or Age, and it is cut and shaped into predetermined configurations for the leads 21 and 22 to complete the semiconductor light emitting device (see FIG. 1).

The semiconductor light emitting element 1 emits light not only from its upper surface but also from its four side surfaces. In order to improve the reflective index of four reflective plates (reflective surface of the recess 7), a high reflective filler agent, such as $TiO_2$, is used. FIG. 13 shows changes in reflective index (in %) with amount of $TiO_2$ (in wt. %). It is known that the reflective index tends to saturate when the amount of $TiO_2$ (titanium oxide) 10% or more). $TiO_2$, however, is expensive, and it usually makes it difficult to mold the resin containing 30% or more $TiO_2$. On account of this, by limiting the amount of $TiO_2$ within 10 to 15%, and one or more of $SiO_2$ (silica), $Al_2O_3$ (alumina), and so on, are used to compensate the desired amount of the filler agent. Thus, an inexpensive resin stem with a high reflective index can be made.

On the other hand, thermosetting resins and thermoplastic resins, in general, have no chemical bonds. Therefore, the adherability is bad, and becomes worse when the temperature increases. To cope with it, after the resin stem is formed by injection-molding the thermoplastic resin, ultraviolet rays are radiated onto the surface. After that, by injecting a thermosetting resin, such as epoxy resin, and heating it, the adherability is improved as shown in FIG. 14. The adhesivity ($N/cm^2$) increases and occurrence of the peel mode (%) decreases with radiation of ultraviolet rays ($mJ/cm^2$). These values apparently show effects of irradiation of ultraviolet rays.

Presumably, irradiation of ultraviolet rays results in breaking C–C' and C—H coupling on the surface of the resin stem and in making dangling bonds, and the dangling bonds of the thermoplastic resin, when heated, contributes to chemical bonding with the thermosetting resin injected later. As a result, the adherability between them can be doubled. The conventional device uses a low-Tg thermosetting resin with an affinity with thermoplastic resins in order to improve their adherability. However, it gives only a small margin for the humidity resistance, and this results in providing a small margin for reliability. The present invention, however, makes it possible to use a high-Tg thermoplastic resin with a high margin in humidity resistance, and hence can remarkably improve the margin for reliability.

Figure 15:
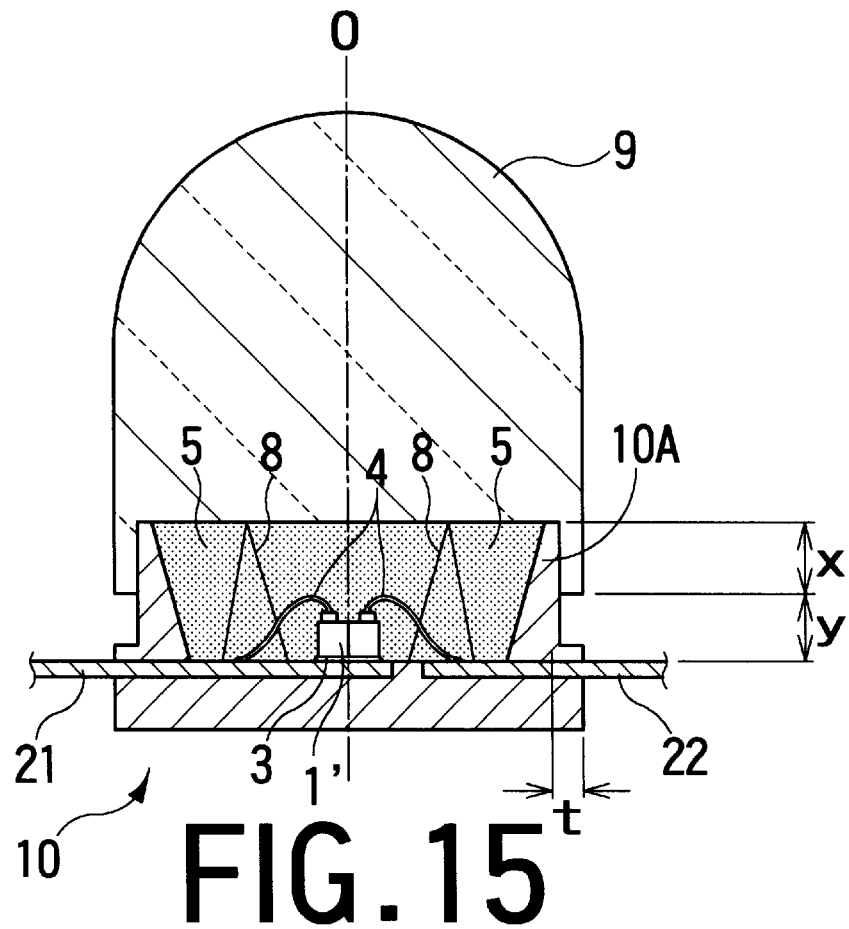
FIG. 15 is a cross-sectional view of a semiconductor light emitting device according to the invention (taken along the A–A' line of FIG. 16)
Figure 16:
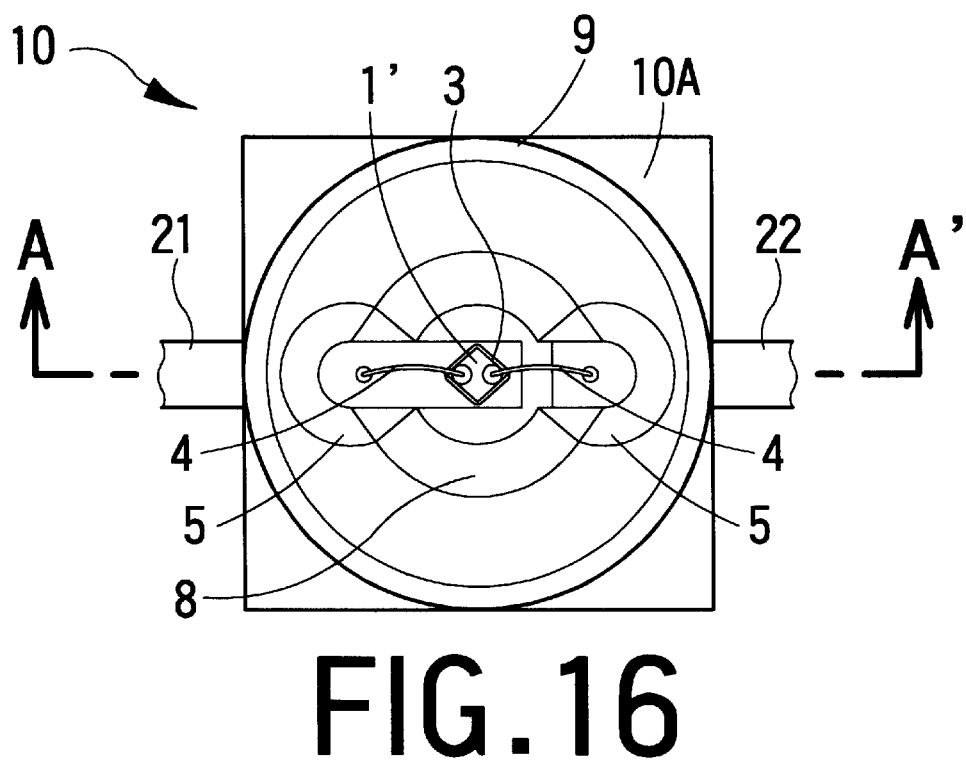
FIG. 16 is a plan view of the semiconductor light emitting device.

Next explained is another embodiment of the invention with reference to FIGS. 15 and 16. This embodiment uses a blue light emitting element or a ultraviolet light emitting element made of a GaN compound material, for example, as its semiconductor light emitting element. FIG. 15 is a cross-sectional view of the semiconductor light emitting device according to the embodiment, and FIG. 16 is its plan view. FIG. 15 is taken along the A–A' line of FIG. 16.

In the semiconductor light emitting device shown here, the semiconductor light emitting element 1' has formed the n-side electrode and the p-side electrode on its upper surface, and they are connected to the leads 21, 22 by bonding wires 4. The bottom surface of the light emitting element 1' is typically an exposed surface of an insulating substrate (such as sapphire substrate). Therefore, short-circuiting does not occur even when the light emitting element 1 is mounted on any one of the leads 21 and 22. In the illustrated example, the semiconductor light emitting element 1' is mounted with its respective edges angled by approximately 45 degrees relative to the lengthwise direction of the leads 21 and 22. The invention, however, is not limited to this. For example, the semiconductor light emitting element 1' may be mounted with a slanting angle other than 45 degrees or with no slanting angle like the embodiment shown in FIG. 1.

In the embodiment shown here, the light emitting element 1' has formed the first electrode and the second electrode on its surface, and wires 4 are connected to these electrodes. Therefore, the recess of the resin portion 10A has a configuration elongated in the direction for connecting the wires 4. That is, the recess is made longer in one direction to provide ample bonding areas for individual wires 4 and shorter in the other direction to decrease distances from the light emitting element 1 to reflective surfaces 8. In this manner, the reflective surfaces 8 can more effectively reflect light emanating from side surfaces of the light emitting element 1', and the light can be taken out with a high efficiency.

In case of a structure different from the illustrated example, where the light emitting element 1 has the p-side or n-side electrode on its bottom surface as one of the preceding embodiments, mounting and bonding of the light emitting element 1 may follow the same embodiment. An example of this type may use a light emitting element made of a SiC compound material, ZnSe compound material or BN compound material, for example. That is, in these cases, an n-type semiconductor substrate is normally used, and wiring is done as illustrated in FIG. 1.

In the embodiment, a fluorescent material may be added to realize a semiconductor light emitting device with a novel structure configured to convert light from the semiconductor light emitting element 1' into different wavelength light before extracting it to the exterior. For example, if an appropriate fluorescent material is mixed when the resin portion 10A is molded, incident light from the light emitting element 1' to the reflective surface 8 of the resin stem is wavelength-converted and extracted to the exterior of the light emitting device as different wavelength light through the encapsulating element 5 and the lens 9.

Usable as the fluorescent material in the embodiment are YAG:Ce compound materials (emitting yellow light) excited by blue-light wavelengths, $Y_2O_2S$:Eu (emitting red light) excited by ultraviolet rays, $(Sr, Ca, Ba, Eu)_{10}(PO_4)_6.Cl_2$ (emitting blue light) and $3(Ba, Mg, Eu, Mn)O.8Al_2O_3$ (emitting green light), for example. When a YAG:Ce fluorescent material is combined with a blue light emitting element, white light can be taken out by mixing yellow light from the fluorescent material and blue light from the light emitting element. While light can be obtained also by mixing ultraviolet-excited red, green, blue light emitting fluorescent materials by an appropriate ratio.

Usable as the light emitting element used in the invention is a blue light emitting element made of a GaN compound material or an ultraviolet light emitting element introduced above. It is also possible to use a light emitting element made of a SiC, ZnSe or BN compound material.

Also when a fluorescent material is applied onto the surface (reflective surfaces) of the resin portion 10A, substantially the same effect is obtained. In this case, especially when appropriate amounts of materials such as titanium oxide and zinc oxide, for example, which reflects ultraviolet to blue light well, are mixed into the stem 10, part of the light from light emitting element passing through the fluorescent material layer is reflected by the reflective surfaces 8 with a high reflective index, and is wavelength-converted when again passing through the fluorescent material layer. Therefore, a semiconductor light emitting device with a high wavelength-converting efficiency and a high light take-out efficiency can be realized.

Further, the same effect is obtained even by mixing a fluorescent material into the adhesive (silver paste) for mounting the light emitting element 1. That is, when light emitted to or toward the bottom surface of the element 1 enters into the adhesive 3 containing the fluorescent material, it is wavelength-converted, and taken out as different wavelength light to the exterior of the light emitting device through the encapsulating material 5 and the lens 9.

Figure 17:
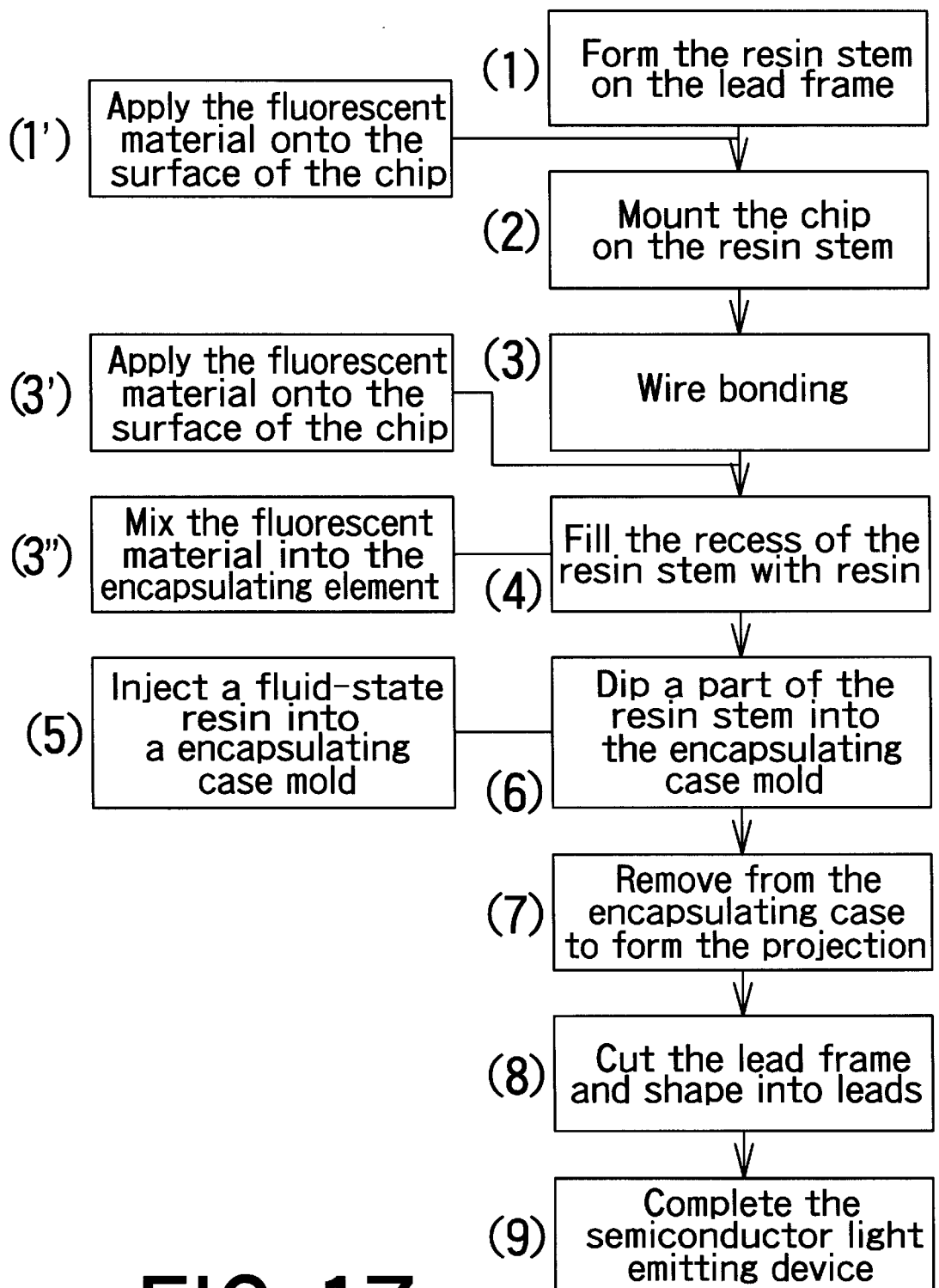
FIG. 17 is a flow chart of a manufacturing process of the semiconductor light emitting device according to the invention.

The same effect is obtained also by mixing the fluorescent material into the encapsulating element 5. FIG. 17 is a flow chart of a process therefor (FIG. 17(3")). By previously mixing an appropriate ratio of a predetermined fluorescent material into the encapsulating material (silicone resin, epoxy resin, etc.) and by molding and thermally setting the encapsulating material, an encapsulating element 5 containing the fluorescent material can be obtained. In this case, by previously setting the encapsulating material prior to forming the lens 9, the fluorescent material mixed into the encapsulating material 5 is held within the encapsulating 5 without dispersing it into the lens when the lens 9 is made. When the encapsulating element 5 is molded and set, the grain size of the fluorescent material and the viscosity of the encapsulating resin before setting may be adjusted such that, due to precipitation of the fluorescent material after injection of the resin, the fluorescent material be localized along the surface of the encapsulating element 5 or along the surface for mounting the light emitting element 1'. By causing precipitation to make the fluorescent material layer in form of a high-density thin film and by optimizing the thickness of the thin film, the wavelength converting efficiency and the light take-out efficiency can be optimized.

Since substantially all of light from the light emitting element 1' enters into the encapsulating element 5 containing the fluorescent material, more effective wavelength conversion is promised than mixture thereof into the resin portion 10A or the adhesive 3. Even when the lens 9 contains the fluorescent material, the same effect can be obtained. Similarly to the encapsulating element, a lens 9 containing a fluorescent material can be made by previously mixing an appropriate ratio of a predetermined fluorescent material into a lens material (epoxy resin, for example) and by molding and thermally setting the lens material.

Alternatively, prior to injection of the resin for molding the encapsulating element 5, the fluorescent material may be applied (coating) onto the surface of the light emitting element 1', or the semi-product may be predipped into a solvent or dispersing medium containing the fluorescent material to immerse the light emitting element 1. Coating of the light emitting element 1' by the fluorescent material may be done either before or after mounting the light emitting element 1'.

Figure 18:
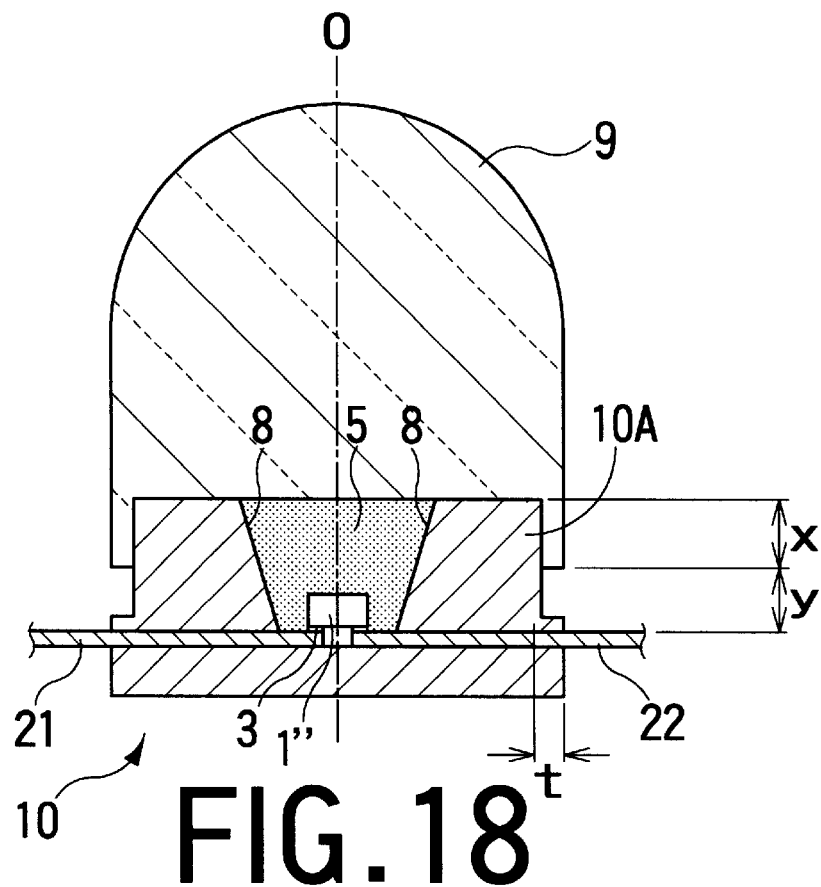
FIG. 18 is a cross-sectional view of a semiconductor light emitting device according to the invention (taken along the A–A' line of FIG. 19)
Figure 19:
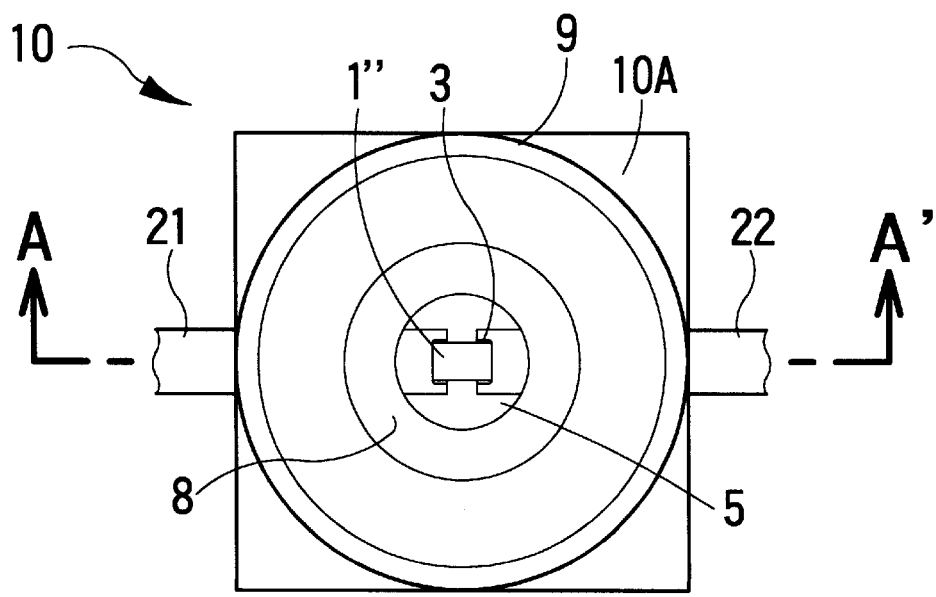
FIG. 19 is a plan view of the semiconductor light emitting device.

Next explained is a further embodiment of the invention with reference to FIGS. 18 and 19. This embodiment uses a flip chip type element as the semiconductor light emitting element. FIG. 18 is a cross-sectional of the semiconductor light emitting device, and FIG. 19 is a plan view. FIG. 18 is taken along the A–A' line of FIG. 19.

In the semiconductor light emitting device shown here, a semiconductor light emitting element 1" has formed an n-side electrode and a p-side electrode directly connected to leads 21 and 22. The light emitted from the element 1" is taken out through the projection 9. Since no wire is used to connect the semiconductor light emitting element 1" to leads 21 and 22, this embodiment requires no bonding region around the light emitting element 1". As a result, the distance from the light emitting element 1" to the reflective surfaces 8 can be minimized in all directions. That is, since all of the reflective surfaces 8 effectively reflects light emanating from any side surface of the light emitting element 1", light can be taken out with a remarkably high efficiency.

The light emitting element 1,1',1" may be a semiconductor light emitting element made of, for example, GaP, GaAlAs, GaAsP, InGaAlP, GaN, or the like. Especially when a GaN, SiC, ZnSe or BN compound material is used to make the light emitting element, light can be taken out in a wavelength-converted form by using one or more fluorescent materials which may be mixed into one of the resin portion 10A of the resin stem 10, encapsulating element 5 or lens 9, or may be applied as a coating onto the inner wall surfaces of the recess of the resin portion 10A or the surface of the semiconductor light emitting element 1".

Figure 20:
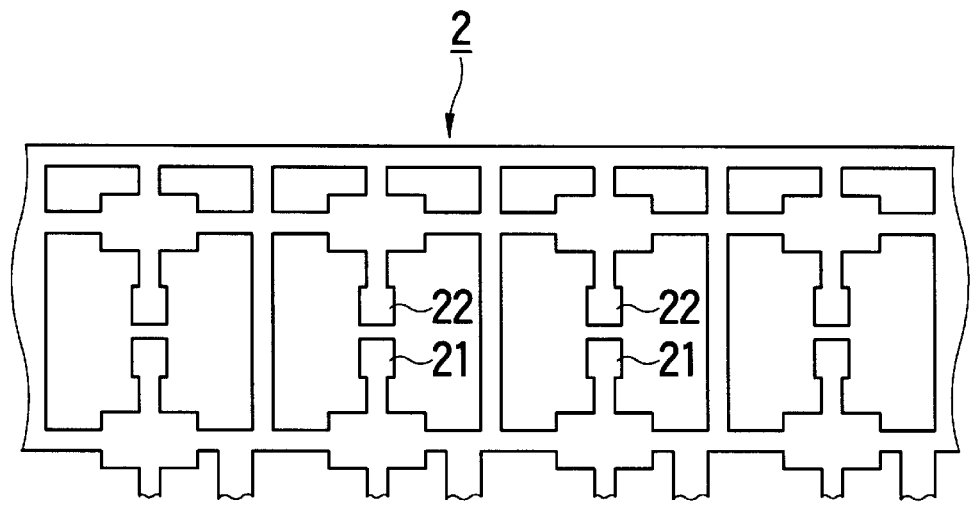
FIG. 20 is a plan view of a lead frame used in the invention.
Figure 21:
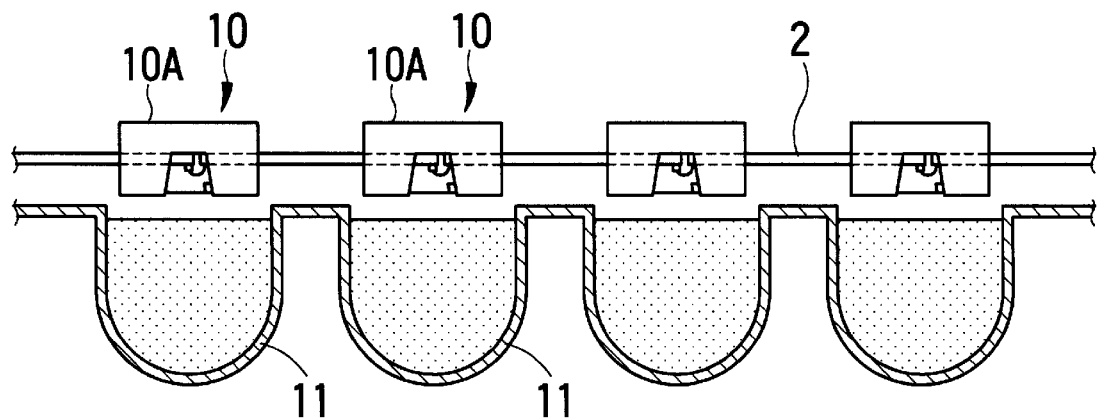
FIG. 21 is a cross-sectional view of a series of case molds and a series of resin stems used in the invention.

Embodiments of the invention have been described above as manufacturing a single semiconductor light emitting device. Actually, however, a plurality of semiconductor light emitting devices can be fabricated simultaneously as shown in FIGS. 20 and 21. That is, semiconductor light emitting devices can be mass-produced by attaching resin portions 10A to individual pairs of leads 21 and 22 of the lead frame 2 (FIG. 20) and by molding projections of a light-transmissive resin on resin stems, using a case mold chain having a number of encapsulating case molds 11 continuously aligned in a row in intervals equal to intervals of the lead pairs or the resin portions 10A (FIG. 21). The lead frame used in the above-explained embodiments has the width (the full length of a pair of leads, including the frame portions at opposite ends of the leads) of approximately 55 mm. Projections can be precisely aligned with resin stems 10 by properly positioning the case mold chain relative to the lead frame.

Reference signs in the claims are intended for better understandanig and shall not limit the scope.

What is claimed is:

1. A semiconductor light emitting device comprising:
   a semiconductor light emitting element;
   a resin stem having a first lead, a second lead and a resin portion partly covering said first and second leads, one end of said first lead and one end of said second lead externally extending from the lower part of the side surfaces of said resin portion, and said resin portion having a recess containing said semiconductor light emitting element, the other end of said first lead electrically connected to a first electrode of said semiconductor light emitting element, and the other end of said second lead electrically connected to a second electrode of said semiconductor light emitting element;
   a light-transmissive resin filling said recess of said resin stem; and
   a projection comprising a light-transmissive thermosetting resin to cover the entire upper surface of said resin stem, said projection extending down onto side surfaces of said resin stem to a predetermined distance from said upper surface to continuously cover the upper part of the side surfaces all around,
   said projection not in contact with said first and second leads extending from said side surfaces of said resin portion, wherein said lower part of said side surfaces protrude farther than said upper part of said side surfaces of said resin portion.

2. The semiconductor light emitting device according to claim 1 wherein said projection forms a lens having a vertical axis aligned with a vertical axis of said resin stem, these center axes being aligned with a vertical axis of said semiconductor light emitting element.

3. The semiconductor light emitting device according to claim 2 wherein said resin stem has at least one through hole in the bottom of said recess.

4. The semiconductor light emitting device according to claim 2 wherein said resin stem has at least one through hole extending from the upper surface to the lower surface thereof.

5. The semiconductor light emitting device according to claim 2 further comprising a fluorescent element for converting light emanating from said semiconductor light emitting element into different wavelength light.

6. The semiconductor light emitting device according to claim 5 wherein said fluorescent element is contained in said resin portion of said resin stem.

7. The semiconductor light emitting device according to claim 5 wherein said fluorescent element is applied onto inner wall surfaces of said recess of said resin stem.

8. The semiconductor light emitting device according to claim 5 wherein said fluorescent element is contained in a mounting adhesive applied onto the bottom surface of said semiconductor light emitting element (1, 1', 1").

9. The semiconductor light emitting device according to claim 5 wherein said fluorescent element is contained in said light-transmissive resin filling said recess.

10. The semiconductor light emitting device according to claim 5 wherein said fluorescent element is contained in said light-transmissive resin forming said projection.

11. A semiconductor light emitting device comprising:
    a semiconductor light emitting element;
    a resin stem having a first lead, a second lead and a resin portion partly covering said first and second leads, one end of said first lead and one end of said second lead externally extending from the lower part of the side surfaces of said resin portion, and said resin portion having a recess containing said semiconductor light emitting element, the other end of said first lead electrically connected to a first electrode of said semiconductor light emitting element, and the other end of said second lead electrically connected to a second electrode of said semiconductor light emitting element;
    a light-transmissive resin filling said recess of said resin stem; and
    a projection comprising a light-transmissive thermosetting resin to cover the entire upper surface of said resin stem, said projection extending down onto side surfaces of said resin stem to a predetermined distance from said upper surface to continuously cover the upper part of the side surfaces all around;
    wherein said recess of said resin stem is longer in a first horizontal direction in which said first and second leads extend than in a second horizontal direction normal to said first horizontal direction, and said projection is not in contact with said first and second leads at said side surfaces of said resin portion, wherein said lower part of said side surfaces protrude farther than said upper part of said side surfaces of said resin portion.

12. The semiconductor light emitting device according to claim 11 wherein said first electrode of said semiconductor light emitting element is connected to said first lead a bonding wire, and said second electrode of said semiconductor light emitting element is connected to said second lead by a bonding wire.

13. The semiconductor light emitting device according to claim 12 wherein said projection forms a lens having a vertical axis aligned with a vertical axis of said resin stem, these center axes being aligned with a vertical axis of said semiconductor light emitting element.

14. The semiconductor light emitting device according to claim 13 further comprising a fluorescent element for converting light emanating from said semiconductor light emitting element into different wavelength light.

15. The semiconductor light emitting device according to claim 11 wherein the vertical center line of said recess is offset from the vertical center line of said resin stem.

16. The semiconductor light emitting device according to claim 15 wherein a second electrode of said semiconductor light emitting element is connected to said second lead a bonding wire, and the vertical center line of said recess is offset from the vertical center line of said resin stem toward the externally extending direction of said second lead.

17. The semiconductor light emitting device according to claim 16 wherein said projection forms a lens having a vertical axis aligned with a vertical axis of said resin stem, these center axes being aligned with a vertical axis of said semiconductor light emitting element.

18. The semiconductor light emitting device according to claim 17 further comprising a fluorescent element for converting light emanating from said semiconductor light emitting element into different wavelength light.

19. A semiconductor light emitting device comprising:

a semiconductor light emitting element;

a resin stem having a first lead, a second lead and a resin portion partly covering said first and second leads, one end of said first lead and one end of said second lead extending externally from the lower part of the side surfaces of said resin portion, and said resin portion having a recess containing said semiconductor light emitting element, the other end of said first lead electrically connected to a first electrode of said semiconductor light emitting element, and the other end of said second lead electrically connected to a second electrode of said semiconductor light emitting element;

a light-transmissive resin filling said recess of said resin stem; and a projection comprising a light-transmissive thermosetting resin to cover the entire upper surface of said resin stem, said projection extending down onto side surfaces of said resin stem to a predetermined distance from said upper surface to continuously cover the upper part of the side surfaces all around;

wherein inner side surfaces of said recess serve as reflective surfaces, and said projection is not in contact with said first and second leads on said side surfaces of said resin portion, wherein said lower part of said side surfaces protrude farther than said upper part of said side surfaces of said resin portion.

20. The semiconductor light emitting device according to claim 19 wherein said resin portion of said resin stem is made from a thermoplastic resin not less than 65 weight % and a filler agent not more than 35 weight %, said filler agent being a high reflective material containing titanium oxide, silicon oxide, and/or aluminum oxide, and titanium oxide occupying 10 to 15 weight %.

21. The semiconductor light emitting device according to claim 20 wherein said projection forms a lens having a vertical axis aligned with a vertical axis of said resin stem, these center axes being aligned with a vertical axis of said semiconductor light emitting element.

22. The semiconductor light emitting device according to claim 21 further comprising a fluorescent element for converting light emanating from said semiconductor light emitting element into different wavelength light.

23. The semiconductor light emitting device according to claim 1 wherein said resin portion is thermoplastic resin.

24. The semiconductor light emitting device according to claim 11 wherein said resin portion is thermoplastic resin.

25. The semiconductor light emitting device according to claim 19 wherein said resin portion is thermoplastic resin.

* * * * *